(12) United States Patent
Zundel et al.

(10) Patent No.: US 7,446,373 B2
(45) Date of Patent: Nov. 4, 2008

(54) SEMICONDUCTOR COMPONENT AND METHOD FOR PRODUCING IT

(75) Inventors: Markus Zundel, Taufkirchen (DE); Rudolf Zelsacher, Klagenfurt (AT); Franz Hirler, Isen (DE); Dietmar Kotz, Moosburg (AT); Hermann Peri, Wernberg (AT); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 354 days.

(21) Appl. No.: 10/939,154

(22) Filed: Sep. 10, 2004

(65) Prior Publication Data

US 2005/0110077 A1 May 26, 2005

(30) Foreign Application Priority Data

Sep. 10, 2003 (DE) ................................ 103 41 793

(51) Int. Cl.
*H01L 29/76* (2006.01)

(52) U.S. Cl. ................. 257/330; 257/327; 257/334; 257/409; 257/E29.04; 257/E29.133

(58) Field of Classification Search ................. 257/329, 257/330, 331, 332, 137, 409, 410, 338, 327, 257/328, 333, 334, E29.012, E29.04, E29.133; 438/409, 459

See application file for complete search history.

(56) References Cited

U.S. PATENT DOCUMENTS

| 5,168,331 | A | | 12/1992 | Yilmaz | |
|---|---|---|---|---|---|
| 5,233,215 | A | | 8/1993 | Baliga | |
| 5,488,236 | A | * | 1/1996 | Baliga et al. | ................ 257/132 |
| 5,998,833 | A | * | 12/1999 | Baliga | ........................ 257/329 |
| 6,258,658 | B1 | * | 7/2001 | Bohm et al. | ................ 438/243 |
| 6,262,453 | B1 | * | 7/2001 | Hshieh | ..................... 257/341 |
| 6,388,286 | B1 | * | 5/2002 | Baliga | ........................ 257/330 |
| 6,429,481 | B1 | * | 8/2002 | Mo et al. | ..................... 257/341 |
| 6,690,062 | B2 | * | 2/2004 | Henninger et al. | .......... 257/340 |
| 6,855,986 | B2 | * | 2/2005 | Hsieh et al. | ................ 257/339 |
| 2003/0209757 | A1 | | 11/2003 | Henninger et al. | |

FOREIGN PATENT DOCUMENTS

| DE | 10061310 | 6/2002 |
|---|---|---|
| EP | 0722189 | 7/1996 |
| WO | WO 03/023862 | 3/2003 |

* cited by examiner

*Primary Examiner*—Sue A. Purvis
*Assistant Examiner*—Fazli Erdem
(74) *Attorney, Agent, or Firm*—Dicke, Billig & Czaja, PLLC

(57) ABSTRACT

A semiconductor component and also a method for producing it are disclosed. In one embodiment, the semiconductor component includes a surface region or a modified doping region is provided alternatively or simultaneously in the edge region of the cell array, in which surface region or modified doping region the doping concentration is lowered and/or in which surface region or modified doping region the conductivity type is formed such that it is opposite to the conductivity type of the actual semiconductor material region, or in which a field plate region is provided.

24 Claims, 6 Drawing Sheets

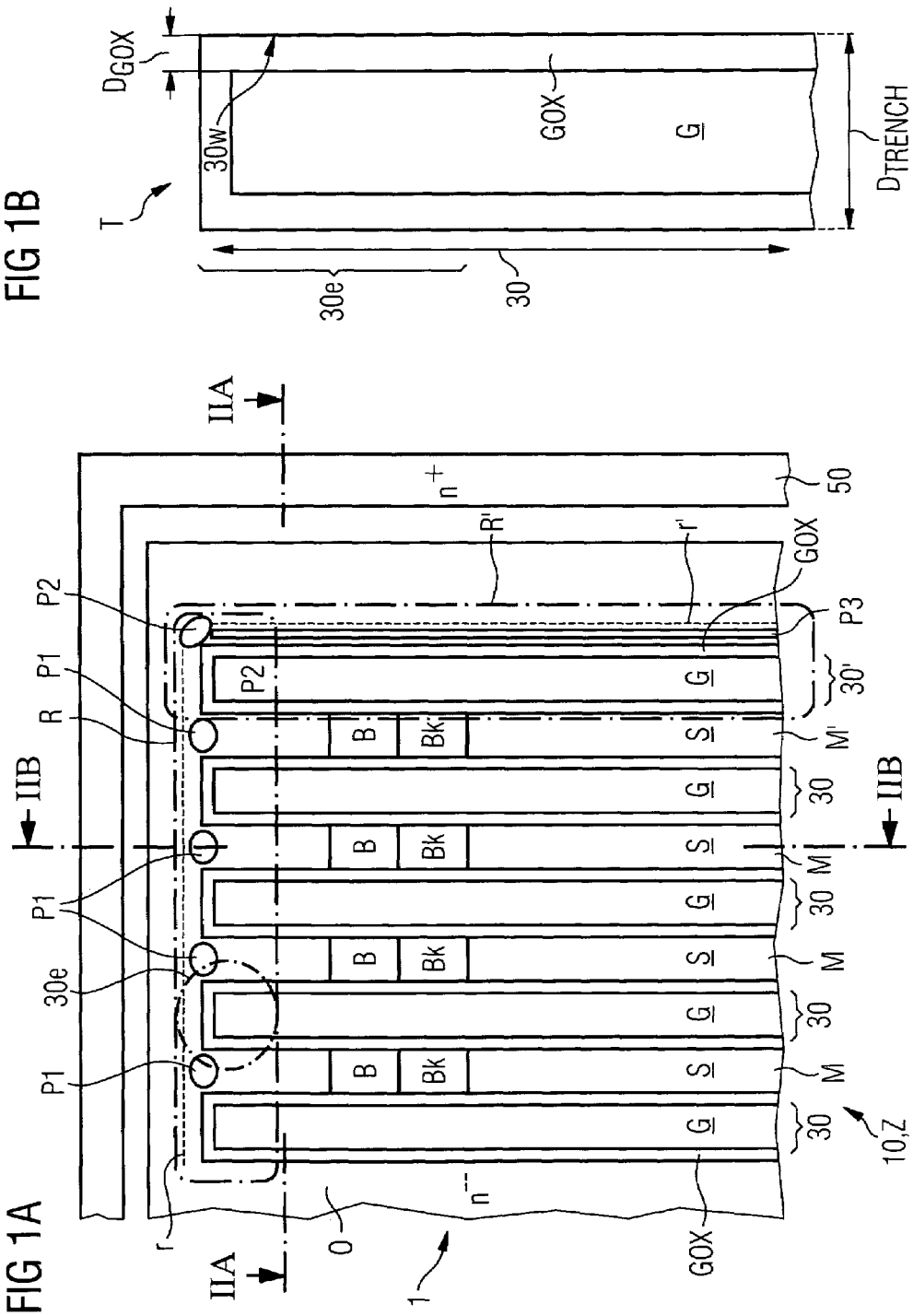

SEMICONDUCTOR COMPONENT AND METHOD FOR PRODUCING IT

CROSS-REFERENCE TO RELATED APPLICATIONS

This Utility Patent Application claims priority to German Patent Application No. DE 103 41 793.1, filed on Sep. 10, 2003, which is incorporated herein by reference.

FIELD OF THE INVENTION

The present invention relates to a semiconductor component and a method for producing it.

BACKGROUND

Reducing the area-specific on resistance $R_{on} \cdot A$ is of great importance in the further development of a multiplicity of semiconductor components, particular attention being given here in particular to the area of power semiconductor components and the so-called DMOS power transistors therein. In this case, one of the essential needs besides lowering the area-specific on resistance $R_{on} \cdot A$ is to simultaneously form a good breakdown or avalanche strength of the semiconductor component respectively produced.

SUMMARY

Embodiments of the invention provide a semiconductor component and method for producing a semiconductor component.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1A illustrates, in diagrammatic plan view, a first embodiment of the semiconductor component according to the invention.

FIG. 1B illustrates, in diagrammatic and sectional plan view, the part of A trench structure in a semiconductor component according to the invention.

DETAILED DESCRIPTION

Figure 2A:
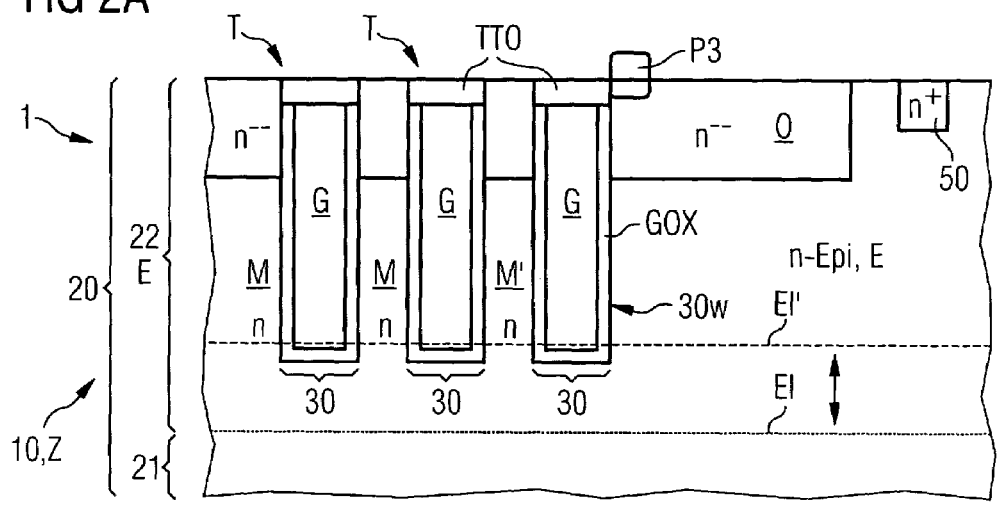
FIGS. 2A, B, C illustrate, in lateral cross-sectional view, the sections along the lines IIA-IIA and IIB-IIB indicated in the embodiment of FIG. 1A.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention is therefore based on specifying a semiconductor component and also a method for producing it in which, even in the edge region of a chip or cell array, it is possible to achieve particularly favourable properties with regard to the on resistivity and the breakdown strength or avalanche strength without a high outlay.

In the case of a semiconductor component according to the invention, in a semiconductor material region or a chip, provision is made of a trench structure semiconductor element arrangement with a semiconductor element cell array of a plurality of trench structure semiconductor elements arranged in strip form, in particular, in trench structures or trenches of the semiconductor material region. Gate electrode regions, gate regions or gate electrodes of the respective trench structure semiconductor elements are essentially formed in each case in the interior of the trench structure and in this case are electrically insulated from wall regions of the trenches or the trench structures in particular by an insulating oxide layer, in particular by a gate oxide in the broader sense. Source regions, body regions and body contact regions—provided if appropriate—of the trench structure semiconductor elements are in each case arranged in the so-called mesa region of the semiconductor material region, namely in the region between directly adjacent trench structures or trenches, the source regions in particular in each case being genuinely contained in the assigned body regions and in particular having a common surface region with the latter.

In accordance with a first embodiment according to the invention, it is provided that, at least in a first or upper edge region of the cell array and/or of the semiconductor material region and/or in a second or lateral edge region of the cell array and/or of the semiconductor material region, a surface region or modified doping region is provided which laterally encloses or embeds lateral end regions of the respective trench structure or at least one marginal mesa region—with respect to the second or lateral edge region—of a corresponding marginal trench structure and in which the doping or dopant concentration is formed such that it is lowered, in particular with respect to an actual doping concentration of a first epitaxial zone, and/or in which the conductivity type or conduction type is formed such that it is opposite to the actual conductivity type or conduction type of the semiconductor material region and, in particular, is of low concentration.

Consequently, it is a central idea of the present first embodiment according to the invention to lower the doping concentration in the corresponding surface region and alternatively or additionally to form there a redoping or opposite doping with respect to the actual conduction type or conductivity type, in particular of weak concentration. By virtue of these measures, the corresponding weak points, namely those breakdown locations which are undesirable, are avoided by the displacement or screening of corresponding high potential gradients and thus high field strength components in the region of these undesirable weak points.

In the case of the second embodiment according to the invention, it is provided that a field plate region is provided at least in the first or upper edge region of the cell array and/or of the semiconductor material region and/or in the second or lateral edge region of the cell array and/or of the semiconductor material region.

The central idea of the second solution according to the invention, namely the provision of the corresponding field plate or the field plate region, achieves a similar effect to that in the abovementioned solution, namely the screening of the undesirable weak points from high potential gradients and thus from high field strengths in order to avoid undesirable breakdowns of the respective regions of the semiconductor component.

The measures provided in the two solutions according to the invention to the underlying object may be provided as alternatives or else be used jointly.

In accordance with a preferred embodiment, it is provided that the modified doping region is formed essentially in a manner patterned laterally or over the whole area.

In a further advantageous refinement of the present invention, it is provided that, in the surface region or in the modified doping region, the concentration of the doping is formed at below approximately 90% or less of the customary dopant concentration of the first epitaxial zone, preferably below approximately 80% thereof, further preferably below approximately 50% thereof, in particular below approximately $10^{16}$ cm$^{-3}$ for a semiconductor component with a breakdown voltage in the region of approximately 60 V, to be precise by choosing the dopant concentration.

Various embodiments are conceivable with regard to the geometrical configuration of the surface region or modified doping region characterized above.

First of all, it is provided that the surface region or the modified doping region extends vertically as far as a depth which vertically encloses or embeds the source regions, the body regions and, if appropriate, the body contact regions.

Alternatively or additionally it is provided that the surface region or the modified doping region extends vertically as far as a depth which almost reaches the depth of the trench structures, in particular approximately 90% thereof, but does not exceed it.

In accordance with a particularly preferred embodiment, it is provided that the surface region or the modified doping region is formed as an epitaxial zone or as a vertical sequence of a plurality of epitaxial zones. These epitaxial areas may in each case be formed with different doping concentrations or dopant concentrations during their processing.

With regard to the field plate region, too, a multiplicity of embodiments are taken into consideration with regard to material configurations and geometry.

Thus, by way of example, it may be provided that the field plate region in the respective trench structure is provided in an upper section, in particular above undesired breakdown regions of the respective trench structure semiconductor element that are to be avoided.

The concept according to the invention can be applied to a multiplicity of semiconductor components which are characterized differently in that the respective trench structure semiconductor elements have different geometries and functionalities.

In accordance with a particularly preferred embodiment, it is provided that the trench structure semiconductor element provided is a trench structure transistor device or a trench transistor. In particular, it may be provided that the trench structure semiconductor element is formed as a field plate transistor with a field plate in the respective trench or in the respective trench structure. Furthermore, it may be provided that the trench structure semiconductor element provided is an n-channel trench transistor, a p-channel trench transistor, a trench transistor with a plurality of electrodes in the trench structure or the like.

Alternatively or additionally it may be provided that a trench structure IGBT is provided as the trench structure semiconductor element.

In accordance with a further additional or alternative refinement of the semiconductor component according to the invention, it is provided that the semiconductor element cell array is formed such that it is patterned in open fashion.

As an alternative thereto, it is provided that the semiconductor element cell array is formed such that it is patterned in closed fashion, in particular with additional trench structures or transverse trenches that run transversely with respect to the trench structures.

The open patterning of the semiconductor element cell array may be realized by providing between the cell array and the first or upper edge region of the cell array and/or of the semiconductor material region or of the chip, at the vertical level of the trench structure, continuously semiconductor material in particular in the form of a mesa, in particular a silicon material and/or in particular in a manner reaching from the surface of the cell array or of the semiconductor material region or chip as far as the depth of the trench structure.

Furthermore, it is alternatively or additionally provided that the cell array is formed by a plurality of trench structures that are essentially identical or spaced apart equidistantly in the form of an essentially homogeneous strip arrangement, and that in particular an essentially homogeneous and strip-type mesa is thereby realized.

In accordance with a further advantageous refinement of the semiconductor component according to the invention, it is provided that the width $D_{Mesa}$ of the mesa region respectively situated between two adjacent trench structures is less than the width $D_{TRENCH}$ of the trench structure, where in particular $D_{Mesa} < D_{TRENCH}$ therefore holds true.

In accordance with another refinement of the semiconductor component according to the invention, it is provided in particular in this case that the width $D_{Mesa}$ of the mesa region respectively situated between two adjacent trench structures is less than 2.5 times the thickness of the field oxide.

The basic concept of the method according to the invention for producing a semiconductor component is formed by the following measures: in a semiconductor material region or chip, provision is made of a trench structure semiconductor element arrangement with a semiconductor element cell array of a plurality of trench structure semiconductor elements arranged in strip form, in particular, in trench structures or trenches of the semiconductor material region. Gate electrode regions or gate regions of the trench structure semiconductor elements are formed essentially in the interior of a respective trench structure and, in particular, in a manner electrically insulated from the wall regions of the respective trench structure by an insulating oxide layer. Source regions, body regions and, if appropriate, body contact regions of the trench structure semiconductor elements are in each case arranged in the mesa regions of the semiconductor material region between adjacent trench structures, the source regions in particular in each case being genuinely contained in the assigned body regions and in particular having a common surface or a common surface region with the latter. The source regions and essentially the semiconductor material region are formed with a first conductivity type or conduction type. The body regions and, if appropriate, the body contact regions provided are formed with a second conduction type or conductivity type.

In accordance with the first method solution to the need on which the invention is based, it is provided that, at least in a first or upper edge region of the cell array and/or of the semiconductor material region and/or in a second or lateral edge region of the cell array and/or of the semiconductor material region, a surface region or modified doping region is provided which laterally encloses or embeds lateral end regions of the respective trench structure or a marginal mesa region—with respect to the second or lateral edge region—of a corresponding marginal trench structure and in which the doping or dopant concentration has been or is formed such that it is lowered, in particular with respect to an actual doping concentration of a first epitaxial zone, and/or in which the conductivity type or conduction type has been or is formed such that it is opposite to the actual conductivity type or conduction type of the semiconductor material region and, in particular, is of low concentration.

In the case of the second method solution to the underlying object, it is provided that a field plate region is provided at least in the first or upper edge region of the cell array and/or of the semiconductor material region and/or in the second or lateral edge region of the cell array and/or of the semiconductor material region.

The two method solutions may be considered as alternatives, but they may also be realized simultaneously in a particularly advantageous manner.

In a preferred embodiment, it is provided that the modified doping region is formed essentially in a manner patterned laterally or over the whole area.

In a particularly advantageous refinement of the production method according to the invention, it is provided that, in the surface region or in the modified doping region, the concentration of the doping is formed at below approximately 90% or less of the customary dopant concentration of the first epitaxial zone, preferably below approximately 80% thereof, further preferably below approximately 50% thereof, in particular below approximately $10^{16}$ cm$^{-3}$ for a semiconductor component with a breakdown voltage in the region of approximately 60 V, to be precise by a corresponding choice of the dopant concentration.

Alternatively or additionally it is provided, in accordance with a further embodiment of the methods according to the invention with regard to the material and geometrical configuration of the surface region or modified doping region, that the surface region or modified doping region extends vertically as far as a depth which encloses or embeds the source regions, the body regions and, if appropriate, the body contact regions.

Additionally or alternatively it is provided that the surface region or modified doping region is formed such that these extend vertically as far as a depth which almost reaches the depth of the trench structures, in particular approximately 90% thereof, but does not exceed it. In another alternative embodiment of the methods according to the invention, it is provided that the surface region or the modified doping region is formed as an epitaxial zone or as a vertical sequence of a plurality of epitaxial zones. In this case, the individual epitaxial zones may also be formed with individual and different doping concentrations or dopant concentrations.

In accordance with a further advantageous refinement of the production methods according to the invention, it is provided that the field plate region is formed in the respective trench structure in an upper section thereof, in particular above undesired breakdown regions of the respective trench structure semiconductor elements that are to be avoided.

Alternatively or additionally it is provided that the trench structure semiconductor element formed is a trench structure transistor device or trench transistor device. In this case, provision may be made, in particular, of a field plate transistor with a field plate in the respective trench or in the respective trench structure. Additionally or alternatively, the trench structure semiconductor elements provided may be in each case an n-channel trench transistor, a p-channel trench transistor and/or a trench transistor with a plurality of electrodes in the trench structure or in the trench.

Alternatively or additionally, a trench structure IGBT may be provided as the trench structure semiconductor element.

In accordance with a further advantageous refinement of the methods according to the invention, it may be provided that the semiconductor element cell array is formed such that it is patterned in open fashion.

As an alternative thereto, it is provided that the semiconductor element cell array is formed such that it is patterned in closed fashion, in particular additional trench structures or transverse trenches running transversely with respect to the trench structures being formed.

With regard to the open patterning, the latter may be realized by providing between the cell array and the first or upper edge region of the cell array and/or of the semiconductor material region or of the chip, at the vertical level of the trench structure, continuously semiconductor material and in particular in the form of a mesa, in particular a silicon material and/or in particular in a manner reaching from the surface of the cell array or of the semiconductor material region or chip as far as the depth of the trench structure.

Furthermore, it may additionally or alternatively be provided that the cell array is formed by a plurality of essentially identical trench structures that are spaced apart equidistantly in the form of an essentially homogeneous strip arrangement, and that in particular an essentially homogeneous and strip-type mesa is thereby realized.

In order to realize the dense trench concept, it may be provided that the width $D_{Mesa}$ of the mesa region respectively situated between two adjacent trench structures is less than the width $D_{TRENCH}$ of the trench structure, where in particular $D_{Mesa} < D_{TRENCH}$ therefore holds true.

Furthermore, it may be provided that the width $D_{Mesa}$ of the mesa region respectively situated between two adjacent trench structures is less than 2.5 times the thickness $D_{FOX}$ of the field oxide. Alternatively or additionally it is provided that the thickness $D_{FOX}$ of the field oxide is significantly greater than the thickness $D_{GOX}$ of the gate oxide in each case in the upper region of the respective trench structure, where in particular $D_{FOX} \geq 1.5\ D_{GOX}$.

Furthermore, it is advantageous if the thickness of the field oxide is significantly greater than the thickness of the gate oxide in the narrower sense, to be precise of the gate oxide in each case in the upper region of the respective trench structure of the respective trench.

Particular attention is given to the concept according to the invention in the application in the so-called dense trench concept. In this case, it is provided that the width $D_{MESA}$ of the mesa respectively situated between two directly adjacent trench structures or of the corresponding mesa region is less than the width of the trench structure $D_{TRENCH}$: $D_{MESA} < D_{TRENCH}$.

In particular, it may be provided in the context of the so-called dense trench concept that the width $D_{MESA}$ of the mesa region respectively situated between two directly adjacent trench structures or trenches is less than 2.5 times the thickness $D_{FOX}$ of the field oxide. In a further advantageous embodiment of the method according to the invention, it is provided that the surface region or modified dopant region and, in particular, the epitaxial zone or the vertical sequence of a plurality of epitaxial zones is formed by means of an epitaxy with vertically stepped dopant concentration, that the trench structures are then etched in such a way that a laterally narrow mesa region is produced, and that an upward concentration or a pile-up effect of the dopant or dopants is then produced by heating and/or by thermal oxidation in the more highly doped region of the respective mesa region.

In this case, it may furthermore be provided that an annealing and/or outdiffusion of the implantations or dopant concentrations is then achieved by heat treatment or by thermal budgets, and that a desired dopant concentration profile is thereby set, in particular in the sequence of the epitaxial zones.

In a further advantageous embodiment of the method according to the invention, it is provided that the profile or the transition of the dopant concentrations, in particular in the sequence of the epitaxial zones is formed in abrupt or stepped fashion, essentially in linear fashion, or essentially in concave fashion.

These and further advantages and aspects of the present invention are also illustrated further on the basis of the remarks below:

Reducing the on resistivity $R_{on} \cdot A$ is of great importance in the development of new generations of DMOS power transistors. A very low area-specific on resistance $R_{on} \cdot A$ can be achieved through the concept of the "dense field plate trench". In order also to obtain good breakdown properties and/or a good avalanche strength besides the low area-specific on resistance $R_{on} \cdot A$, it is imperative to optimize both the dense trench cell and the chip edge. The conventional chip edge concepts prove to be disadvantageous for the dense trench concept, primarily owing to the ever shrinking structures or mesa width. This suggests the design of a new chip edge concept.

Objectives:

Reducing the on resistivity $R_{on} \cdot A$ is of great importance in the development of new generations of DMOS power transistors. A very low $R_{on} \cdot A$ can be achieved through the concept of the "dense field plate trench". The ever shrinking structures in this case, in particular the Si mesa width between the trenches, require new measures in order to eliminate weak points in the chip edge region, specifically in the region towards the surface.

Alternatively or additionally there is a new patterning of the epitaxial layer in the cell array such that the severe dopant pile-up effect—which occurs primarily in the case of the dense trench concept—and the undesirable adverse effects thereof on the threshold voltage and the breakdown properties of the transistor are largely eliminated.

Problems:

On the one hand, weak points are manifested only to an insignificant extent in the chip edge region in conventional trench transistors if or as long as the mesa width between the trenches has hitherto been significantly greater than in the case of the dense trench concept. Furthermore, these weak points have additionally been alleviated by means of the so-called T-piece layout of the chip edge.

The abovementioned weak points (see FIGS. 1A, 2A, 2B) arise only when the mesa width is significantly reduced towards the surface as a result of the tapering of the trenches. Since a tapering of the trenches typically amounts to 1-3° and principally extends down to a depth of approximately 1.0-2.0 µm, this results in a mesa width loss of approximately 100-150 nm. This effect will become apparent only if the mesa width is of the same order of magnitude and/or the breakdown voltage is critically dependent on the mesa width. Both factors exist in the dense trench regime: the mesa width is typically in the range of 500-1500 nm depending on the voltage class and the breakdown voltage is in principle greatly dependent on the mesa width. Both excessively large and excessively small mesa widths cause low breakdown voltages. The trench tapering is necessary at the present time, in principle, since suitable poly filling of the trenches is not possible without it. The so-called T-piece layout is likewise unfavourable in the dense trench regime since it produces further weak points and thus reduced breakdown voltages in the 90° trench corners of the T-pieces.

Consequently, it is necessary to implement new measures in order to eliminate the weak points at or in the chip edge of a dense trench transistor.

On the other hand, there is furthermore the problem of the so-called epitaxial dopant pile-up effect in the epitaxial zone. This problem is manifested only to an insignificant extent in conventional trench transistors if the mesa width between the trenches has hitherto been significantly greater than in the case of the dense trench concept now used. An appreciable pile-up effect arises only when the volume of the mesa between the trenches after all thermal oxidations amounts to only 80% or less of the mesa volume directly after trench etching. Only with the introduction of the dense trench concept does the mesa volume after all oxidations amount to only approximately 50-60% of the volume of the mesa directly after dense trench etching. Thus, a severe phosphorus pile-up effect now becomes apparent in the case of homogeneous epitaxial doping (here with phosphorus) in the dense trench regime.

Figure 4A:
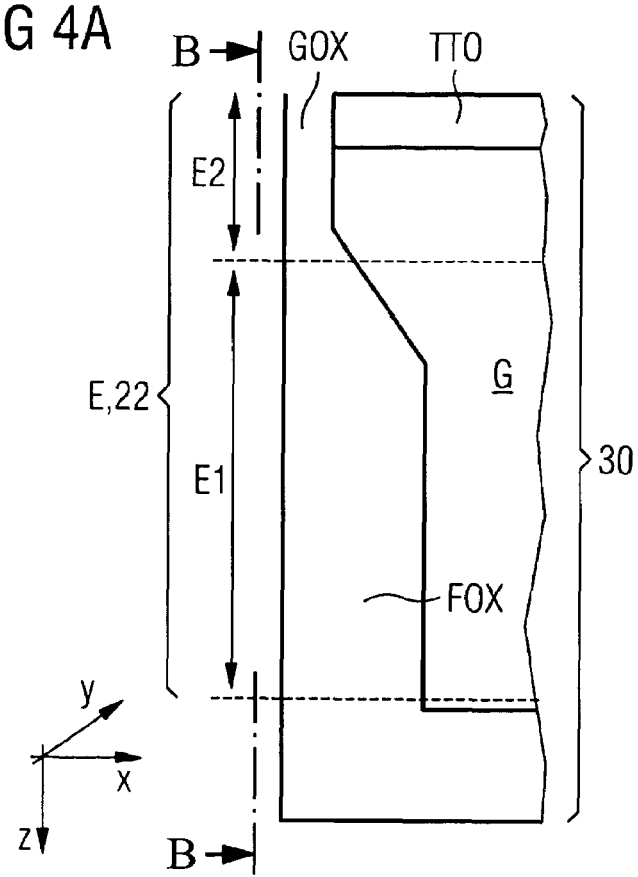
FIGS. 4A, B illustrate, in diagrammatic and partially sectional side view, a semiconductor component according to the invention and a graph for representing the dopant concentration profile according to various intermediate states of the production method according to the invention.

In FIG. 4A, half a mesa and half a trench have been examined by means of process simulation. The phosphorus concentration rises greatly towards the channel region and towards the surface. This can also be discerned in the corresponding sections or profiles of FIG. 4B. This results in the following consequences for the transistor cell: in the surface region, a concentration elevation of almost a factor of 2 occurs, which, however, is completely superposed by the source and body contact zones and has no further effects in the cell. In the channel region, the elevation amounts to approximately 70%, which here has highly adverse effects on the threshold voltage. A significantly higher body dose would have to be introduced here in order to compensate for the pile-up. The consequence of this, however, is that the channel mobility decreases on account of the high overall doping and the channel proportion in the on resistance or RonA therefore increases. Since the phosphorous pile-up is directly dependent on fluctuations in the mesa width, consequently the countercompensation by the body dose is also affected thereby and the Uth, by means of the phosphorus pile-up effect, is thus additionally coupled to the fluctuations in the mesa width, which may lead to the restriction of the process windows and thus to increased losses of yields. In the lower half of the mesa through to the trench bottom region, the elevation is still approximately 20%-30%, which has a significant effect here on the breakdown properties (the breakdown site). If there is too much charge in the mesa in this region, then the breakdown voltage can no longer be maintained and/or the breakdown site shifts from the trench bottom (desired) to the field plate step (undesired). In particular, a significantly higher charge in the region of the field plate step in comparison with the trench bottom is critical and is to be avoided. A somewhat higher charge in the intermediate zone or towards the trench bottom would be advantageous, by contrast. On account of the effect that the phosphorus pile-up takes place in the entire mesa and the phosphorus concentration that is thereby increased accumulates particularly in the upper part of the mesa and can subsequently diffuse away only downwards during heat treatments, the breakdown voltage is now also particularly greatly dependent on the pile-up. The fundamental dependence of the breakdown voltage on the mesa width is thus accompanied, by means of the phosphorus pile-up and the outdiffusion of the phosphorus in the direction of the trench bottom, by an additional component that additionally restricts the production window.

Solution:

The present idea provides, on the one hand, for the alleviation of the weak points in the chip edge region by lowering the effective epitaxial concentration at the surface and/or redoping the epitaxial concentration at the surface and/or by placing thereabove a field plate made of metal, poly or the like. The potential lines are thereby partly forced away from the weak points and thereby lower the electric fields at the weak points.

a)

The first approach is for example to significantly reduce the epitaxial concentration towards the surface, in particular tending into the range below approximately $10^{16}$ cm$^{-3}$. This can be achieved with a two-stage epitaxial layer. In this case, the intention ideally is to conduct an epitaxy process which firstly begins with the desired dopant gas flow. Once the epitaxial layer has reached a suitable first thickness d1, then ideally only the dopant gas flow is to be stopped and, consequently, a second, largely undoped epitaxial layer having the thickness d2 is to be produced. The thickness d2 is preferably to be chosen to be thick enough that at the overall end of the process including all the thermal diffusions, the surface concentration then lies in the upper $10^{15}$ cm$^{-3}$ range. The phosphorus concentration that is lowered towards the surface then advantageously has the effect that, in the region of the trench ends at the chip edge in proximity to the surface, the p-type concentration can be lowered to an extent such that even a mesa that is narrowed to a great extent by the tapering of the trenches can maintain the required breakdown voltage. Without the measure proposed, the phosphorus concentration would increase significantly at this location, which would lead all the more to a great reduction of the breakdown voltage.

b)

The second approach is for example to use a light counterdoping (e.g., whole-area or masked implantation) to lower the effective epitaxial concentration in proximity to the surface in the region of the weak points, preferably once again into the range below approximately $10^{16}$ cm$^{-3}$.

c)

The third approach is for example to use a heavier counterdoping to lightly redope the zone near the surface. This relieves the burden on the original weak point, but can give rise to new weak points at the chip edge in the event of excessively heavy redoping, see e.g., FIGS. 1, 2A, 2B. Thus, the counterdoping has to be set suitably here such that, even outside the trench regions, it is possible to maintain the breakdown voltage in the resulting pn diode (P4-P6) near the surface.

d)

The fourth approach is to use a field plate, situated above the weak points P1-P3 and isolated by an oxide layer (usually intermediate oxide) to largely force the potential lines away from the weak point. In this case, the field plate must be arranged at a suitable distance from and with a suitable overlap with respect to the weak point and may be embodied as metal, polysilicon or the like.

Figure 3A:
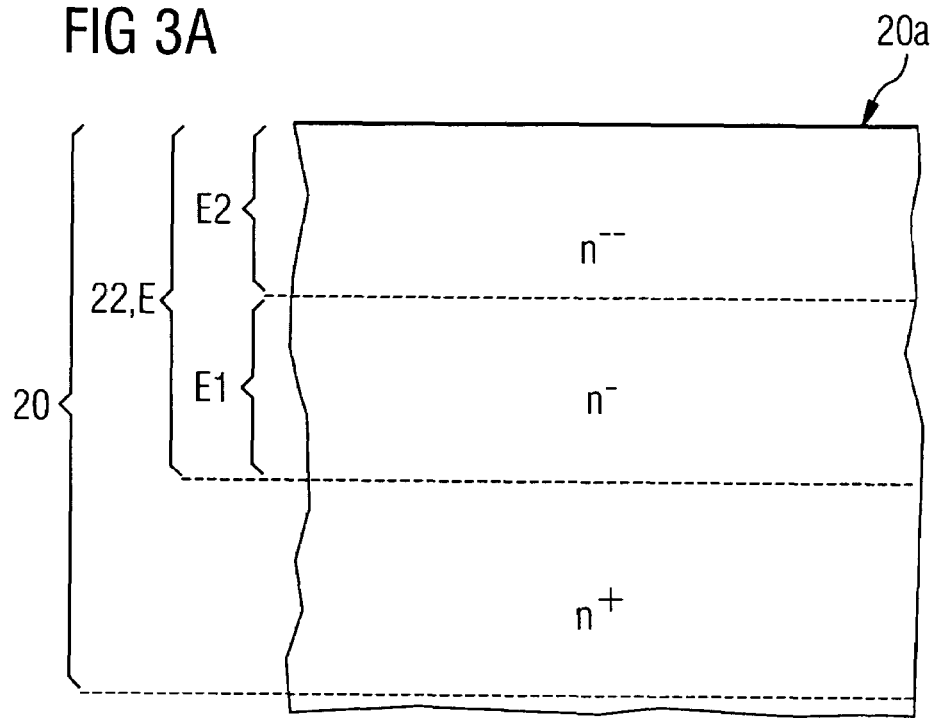
FIGS. 3A-D illustrate, in diagrammatic and sectional side view, various intermediate states which are attained in accordance with an embodiment of the production method according to the invention.
Figure 3B:
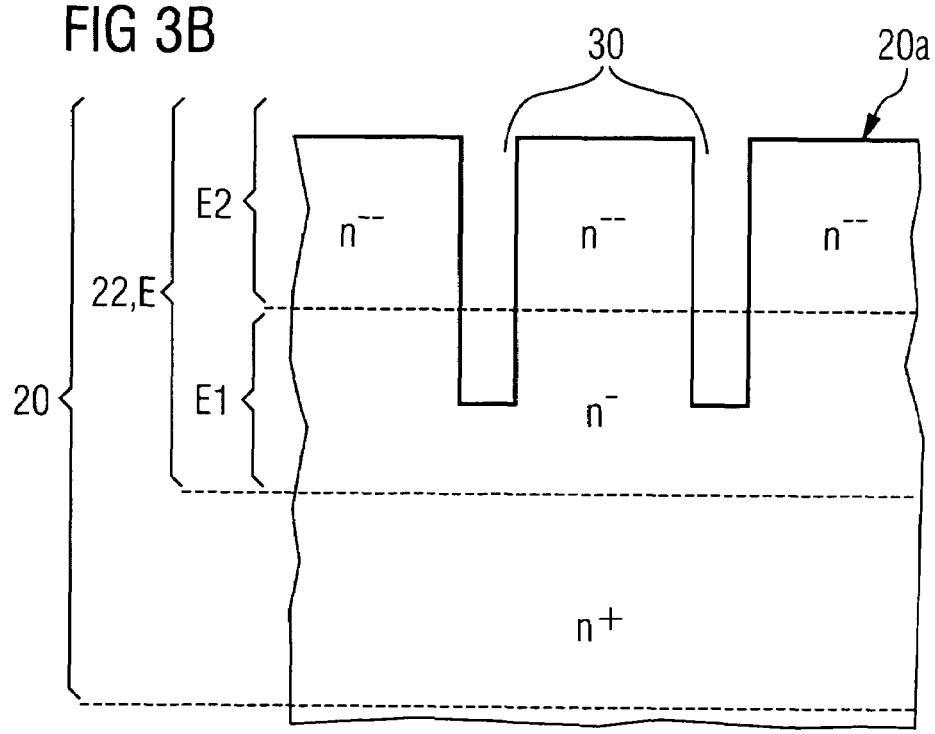
Figure 3C:
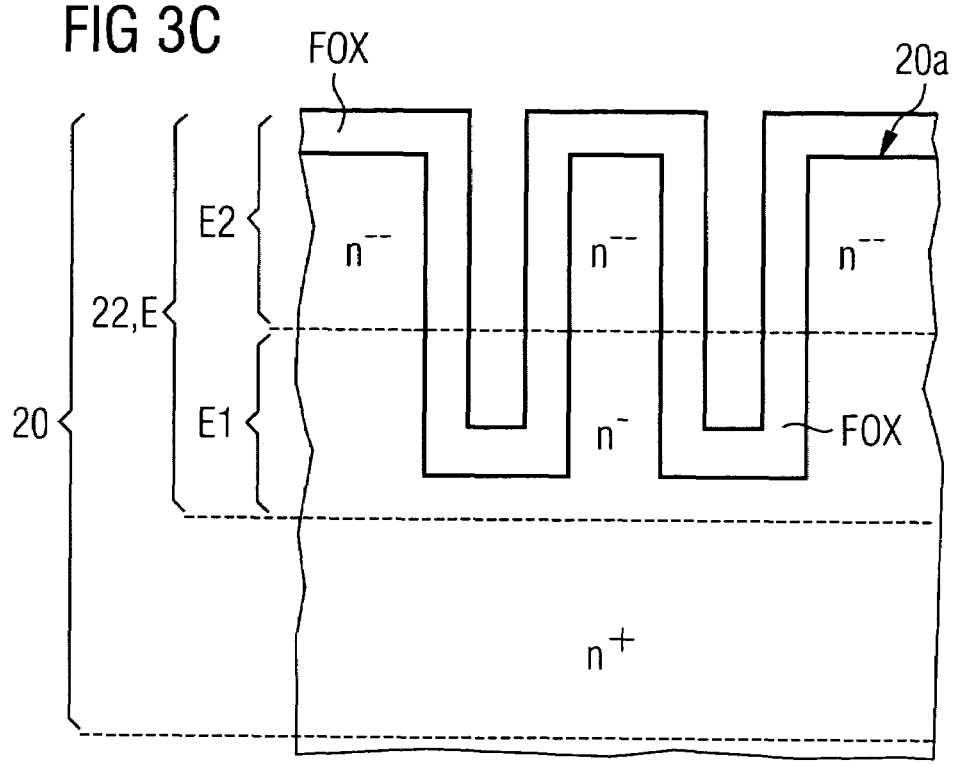

The present idea provides, as an alternative or in addition, for the use of an epitaxial layer with a two-stage dopant concentration. In this respect, see the basic structure in FIGS. 3A-3D. In this case, the intention ideally is to conduct an epitaxy process which firstly begins with the desired dopant gas flow. Once the epitaxial layer has reached a suitable first thickness d1 with a suitable dopant concentration c1, then ideally only the dopant gas flow is to be stopped and a second, largely undoped epitaxial layer having the thickness d2 is thus to be produced (with a concentration c2≈0). The thickness d2 is preferably as thick as the later source and channel zone together. An exemplary profile directly after the epitaxy is shown in FIG. 4B. Due to the thermal budget of the rest of the process and the remainder of the phosphorus pile-up effect in the epitaxial layer 1, the sharp profile form directly after the epitaxy becomes a blurred profile form at the end of the process. However, the profile at the end of the process exhibits a dopant concentration that decreases towards the surface, instead of the greatly rising concentration as in the case of the full pile-up effect. In the case of the full pile-up effect, the greatest concentration elevation was observed in the mesa in proximity to the surface, since the pile-up accumulated from three sides there. The absent phosphorus concentration at the surface advantageously has the consequence that this is prevented and that the pile-up effect that takes place in the centre of the mesa, by means of subsequent thermal budgets, can dissipate both downwards into the mesa and into the substrate and upwards into the mesa. In the channel region, this results in the advantages that the body dose for setting the threshold voltage can then be reduced and that it has now become largely independent of the phosphorus pile-up and thus also of the mesa width. It is furthermore advantageous that the channel mobility could be improved by means of the reduced overall doping (epitaxial doping and countercompensation can be reduced). In the lower half of the mesa through to the trench bottom region, there now results the virtually ideal charge distribution with a maximum in the lower trench half, which ensures a breakdown in the trench bottom region with a high breakdown voltage. The above-discussed additional component of the dependence of the breakdown voltage on the mesa width can now be significantly reduced, since the remaining smaller phosphorus pile-up can now be distributed both upwards and downwards.

Concept:

The present idea provides for alleviating the weak points in the chip edge region by lowering the effective epitaxial concentration at the surface and/or redoping the epitaxial concentration at the surface and/or by placing thereabove a field plate made of metal/poly/etc. A large part of the potential lines are thereby forced away from the weak points and thereby reduce the electric fields at the weak points.

In order to reduce great epitaxial dopant concentration increases (pile-up effect) in very narrow mesa zones between the trenches and the resultant unfavourable influences on the transistor channel and the breakdown properties, it is proposed to introduce an epitaxial layer with two doping levels (undoped in the surface and channel regions and doped in standard fashion in the depth). The pile-up effect can then no longer occur near the surface, and the pile-up effect that occurs in the depth can dissipate upwards and downwards by means of subsequent thermal budgets in the narrow mesa zones and thereby becomes non-critical. As a result, the threshold voltage becomes large independently of the pile-up. The breakdown properties can readily be improved. A production process is described to supplement the structure.

Possible Production Process:
a) Epitaxy with stepped dopant profile
b) Trench etching, a narrow mesa is thereby produced
c) Thermal oxidation, which produces a pile-up effect in the more highly doped region of the mesa (e.g., trench rounding oxidation, field plate oxidation, gate oxidation, . . . )
d) Polyfilling and polyrecess, filling the trenches with oxide, planarization, implantations for body, source, body contact
e) Heat treatment or thermal budgets for annealing and out-diffusion of the implantations, which distribute the pile-up in the mesa upwards and downwards in a controlled manner in order to achieve an ideal dopant profile (i.e., lowest epitaxial doping in the channel region, maximum epitaxial doping "somewhere" between field plate step and trench bottom).
f) Intermediate oxide deposition, production of contact holes to source, body, gate poly, metallization of the surface and of the rear side (drain terminal).

FIG. 1A illustrates, in diagrammatic plan view, a first embodiment of the semiconductor component 1 according to the invention. A trench structure semiconductor element arrangement 10 in the form of a cell array Z with a plurality of trench structure semiconductor elements T is formed in a semiconductor material region 20, which may also be referred to as chip for the sake of simplicity. In the case of the embodiment shown in FIG. 1A, the trench structure semiconductor elements T are so-called trench transistors T, so that the trench structure semiconductor element arrangement 10 is a trench structure transistor arrangement 10 in the form of a cell array Z. The trench structures 30 or trenches 30 provided are formed parallel to one another and equidistantly in the semiconductor material region 20. The trenches 30 are essentially of the same type, in particular with regard to their patterning, for example with regard to their external width $D_{TRENCH}$, which is chosen to be identical for all the trenches. The intermediate regions M, M' between directly adjacent trenches 30 are also referred to as mesa and have an identical width or mesa width $D_{Mesa}$ for the entire cell array Z.

The illustrations specified in FIG. 1 and also in the subsequent figures are not true to scale with regard to the dimensioning and geometrical dimensions.

With regard to the end regions 30e of the trenches 30, the cell array Z has first or upper and lower edge regions R and edges r. The edges r correspondingly form first or upper and lower edge regions R of the cell array Z or of the semiconductor material region 20 or of the chip. Laterally, second or lateral edges r' are formed with corresponding second or lateral edge regions R' of the cell array Z.

Gate regions G or gate electrodes G are formed in the interior of the trench structures 30 and 30'. In order to electrically insulate the gate regions G from the surrounding mesas M and M', a so-called gate oxide GOX is formed on the wall regions 30w of the trench structures 30, 30'. Corresponding source regions S, body regions B and—in this case—also body contact regions Bk are formed and indicated in the mesa regions M, M'.

The actual semiconductor substrate 20 or the semiconductor material region 20 is n$^+$-doped. The source region S is in each case likewise formed such that it is n$^+$-doped, whereas the body regions B, in which source regions S are embedded, are formed such that they are p-doped. The body contact regions Bk are in each case p$^+$-doped.

In the case of cell arrays Z of conventional semiconductor components, the following weak points occur, under certain circumstances, with regard to potential gradients or field strength maxima: this involves weak points P1 in the first or upper edge region R or edge r between directly adjacent trench structures 30, that is to say directly at or in the end regions of the mesas M, M'. Furthermore, a weak point P3 is present directly in the course of the second or lateral edge region R' or edge r' of the cell array Z. A breakdown weak point P2 is likewise present in the region of the overlap between the first edge r and the second edge r', that is to say in the corner region of the cell array Z or the trench structure semiconductor element arrangement 10.

In order to avoid the weak points or in order to displace the elevated potential gradients or field strengths from the region of the weak points P1 to P3, the invention provides, in the embodiment of FIG. 1, a surface region O or modified doping region O in an upper layer region of the semiconductor material region 20, which is formed such that it is n$^-$-doped or else may have a p$^-$-type doping.

FIG. 1B illustrates details of a trench structure 30 in the region of the end 30e of said trench structure 30. The trench 30 has an external width or trench width $D_{TRENCH}$ and is filled with the material of a gate region G and is formed in a manner electrically insulated from said gate region G by means of a gate oxide region GOX in the wall region 30w of the trench 30.

Figure 2B:
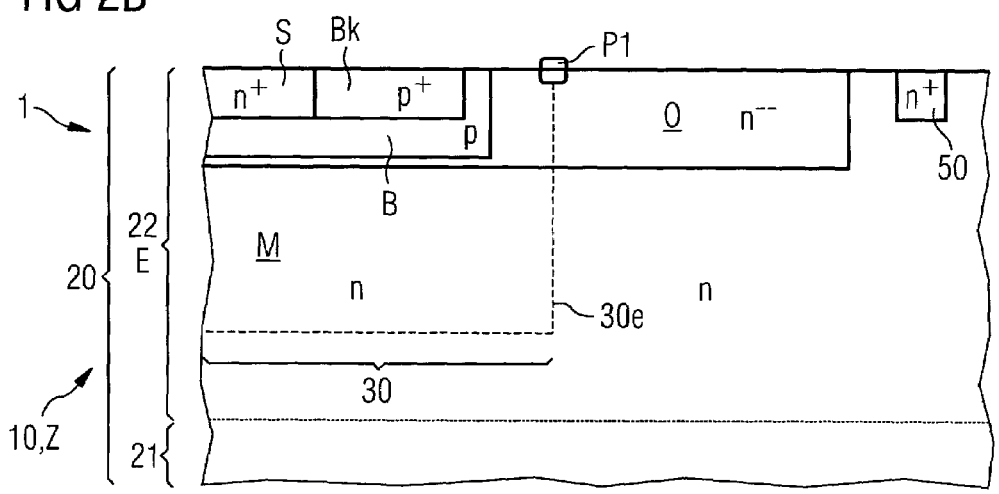

FIG. 1A illustrates section lines IIA-IIA and IIB-IIB, the associated sections of which and the corresponding structures are reproduced in FIGS. 2A and 2B (for an n-type embodiment of the invention) and 2C (for a p-type embodiment of the invention).

Figure 2C:
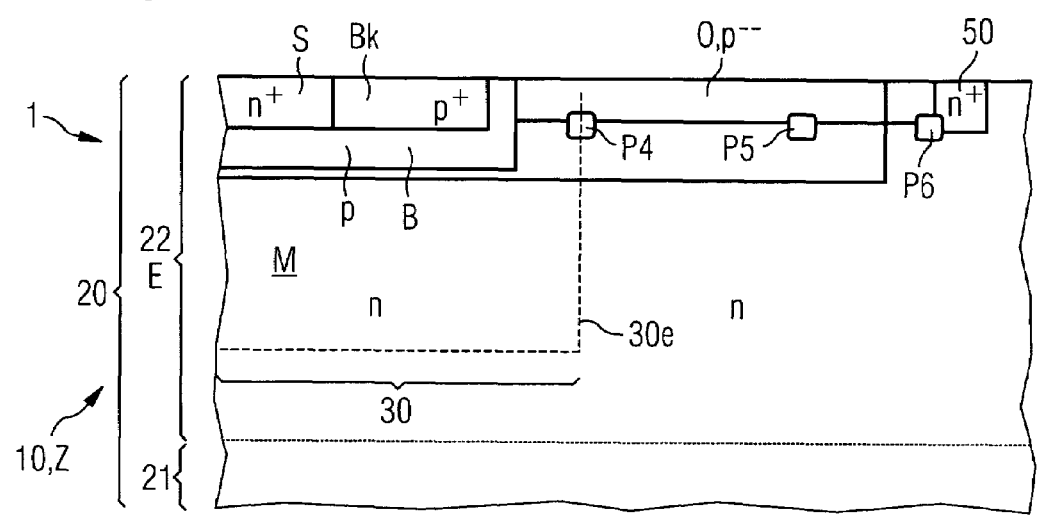

FIGS. 2A to 2C also illustrate the patterning of the material arrangement of the semiconductor component 1 according to the invention. The trench structure semiconductor element arrangement 10 respectively provided in this case or the corresponding cell array Z is based on a semiconductor material region 20 with a semiconductor substrate 21 and an epitaxial region 22 or E situated thereabove. The lower region boundary EI of the epitaxial region E may vary in the extent of its depth, e.g., through to the plane EI'.

The actual semiconductor substrate 21 is formed such that it is n$^+$-doped. The overlying epitaxial zone E, 22 is an n-doped epitaxial zone. It may be formed as far as a depth greater than the trench depth (case EI) or else as far as a depth somewhat less than the trench depth (case EI'). In the region below the surface 20a of the semiconductor material region 20, the corresponding surface region O or modified doping region O is provided with weak n-type doping, that is to say with an n$^-$-doping.

As emerges from the sections of FIGS. 2A to 2C, the n$^-$-doped surface region O or modified doping region O has a vertical depth that embeds or encloses the source region S, the body region B and the body contact region Bk, but does not exceed the depth of the trench 30 with its end region 30e, said trench being indicated in a dotted manner. FIGS. 2A to 2C also indicate the corresponding field strength weak points that may become problematic in conventional trench structure semiconductor elements, namely the weak points P1, P3-P6.

The illustration shows—as in FIG. 1A as well—the n$^+$-doped source implantation ring 50, which represents an optional element.

FIGS. 3A to 3D show a possible process implementation that may lead to the formation of the trench structure semiconductor element arrangement 10 shown in FIG. 1A or in FIGS. 2A-2B or to the corresponding cell array Z.

The starting point is formed by a semiconductor material region 20 with $n^+$-doping, in the upper region of which an epitaxial region E, 22 having a first epitaxial layer E1 with $n^-$-doping and having a second epitaxial layer E2 with $n^-$-doping has been or is formed. In the epitaxial region 22, E, corresponding trench structures 30 are introduced into the surface region 20a of the semiconductor material region 20, as is illustrated in FIG. 3B, and then subsequently oxidized with an insulating oxide, here in the form of a field oxide FOX, thereby lining the wall regions 30w of the trench structures 30, as is illustrated in FIG. 3C.

Figure 3D:
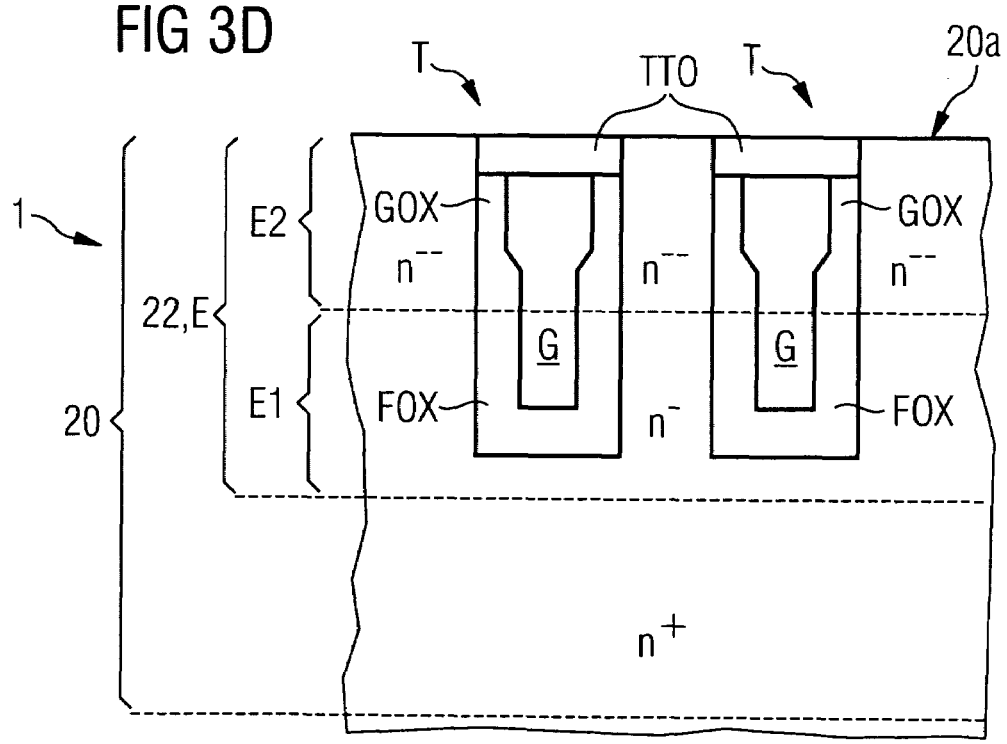
Figure 4B:
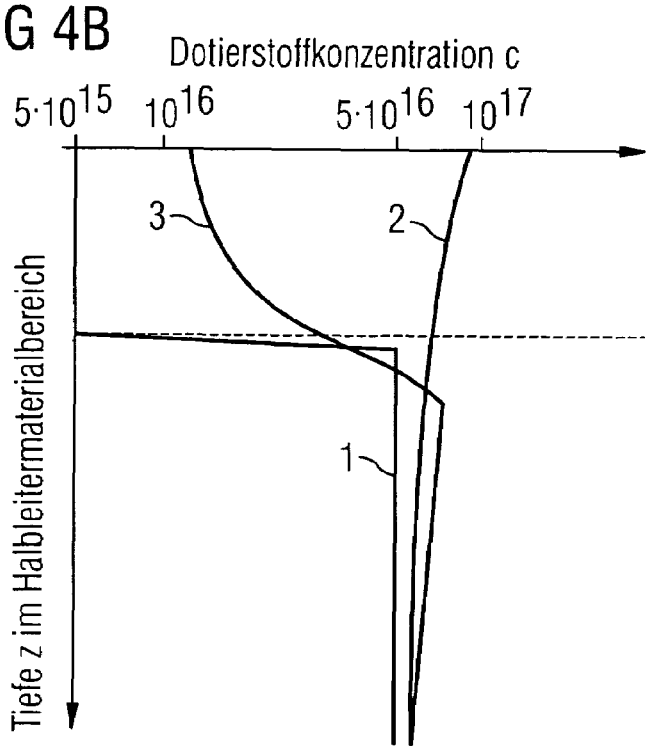

In further process steps, the respective trench structure semiconductor elements T in the form of trench structure transistor devices T with the corresponding gate regions G, field oxide regions FOX, gate oxide regions GOX and trench top oxide regions TTO are then completed and contact-connected, as is shown in FIG. 3D.

FIG. 4A illustrates, in diagrammatic and sectional side view, a part of a semiconductor component 1 according to the invention and the corresponding semiconductor material region 20 formed there. The section line B-B is also depicted, and FIG. 4B refers to various intermediate states of an embodiment of the production method according to the invention, the individual curves representing the dopant concentration profiles assigned to the various production steps.

Curve 1 illustrates the profile of the dopant concentration or the dopant profile directly after performing the epitaxy. As emerges from FIG. 4B in conjunction with FIG. 4A, the second, lower epitaxial zone E2 has a dopant concentration of approximately $5\times10^{16}$ cm$^{-3}$, whereas the second, upper epitaxial zone E1 receives a vanishing dopant concentration. Thus, a gradated dopant concentration or a gradated dopant profile is present, then, in the entire epitaxial zone E comprising the first and second epitaxial zones E1 and E2, respectively.

Curve 3 illustrates the dopant profile or the profile of the dopant concentration after the end of the production method according to the invention. The thermal oxidation step compensates for the so-called effect of upward concentration or of the so-called pile-up by virtue of the low initial dopant concentration in the second or upper dopant zone E2. Consequently, a very low doping results in the channel region and a maximum doping lying slightly above the original value of $5\times10^{16}$ cm$^{-3}$ owing to the pile-up effect results in the intermediate region towards the end of the trench structure.

In comparison therewith, curve 2 shows the profile of the dopant concentration in the case of a conventional processing method in which an initial dopant concentration of $5\times10^{16}$ cm$^{-3}$ is formed in the entire epitaxial zone E, that is to say E1 and E2. It can clearly be discerned that, as a result of the spatial propagation of the oxidation front during the thermal oxidation, on account of the dopant particles being pushed together in front of the oxidation front, an upward concentration arises both in the epitaxial zone 1 and in the epitaxial zone 2. Such an upward concentration leads to the above-described disadvantages and problems in the prior art.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, in which, in a semiconductor material region or chip, provision is made of a trench structure semiconductor element arrangement with a semiconductor element cell array of a plurality of trench structure semiconductor elements arranged in strip form, in particular, in trench structures or trenches of the semiconductor material region, in which gate electrode regions or gate regions of the trench structure semiconductor elements are formed essentially in the interior of a respective trench structure and, in particular, in a manner electrically insulated from wall regions of the respective trench structure by an insulating oxide layer, in which source regions, body regions and, if appropriate, body contact regions of the trench structure semiconductor elements are in each case arranged in the mesa regions of the semiconductor material region between adjacent trench structures, the source regions in particular in each case being genuinely contained in the assigned body regions and in particular having a common surface region with the latter, in which the source regions and essentially the semiconductor material region are formed with a first conductivity type or conduction type and the body regions and, if appropriate, the body contact regions are formed with a second conductivity type or conduction type, and in which, at least in a first or upper edge region of the cell array and/or of the semiconductor material region and/or in a second or lateral edge region of the cell array and/or of the semiconductor material region, a surface region or modified doping region is provided which laterally encloses or embeds lateral end regions of the respective trench structure or at least one marginal mesa region with respect to the second or lateral edge region of a corresponding marginal trench structure and in which the doping or dopant concentration is formed such that it is lowered, in particular with respect to an actual doping concentration of a first epitaxial zone, and/or in which the conductivity type or conduction type is formed such that it is opposite to the actual conductivity type or conduction type of the semiconductor material region and, in particular, is of low concentration.

2. The semiconductor component according to claim 1, comprising providing a field plate region at least in the first or upper edge region of the cell array and/or of the semiconductor material region and/or in the second or lateral edge region of the cell array and/or of the semiconductor material region.

3. A semiconductor component, in which, in a semiconductor material region or chip, provision is made of a trench structure semiconductor element arrangement with a semiconductor element cell array of a plurality of trench structure semiconductor elements arranged in strip form, in particular, in trench structures or trenches of the semiconductor material region, in which gate electrode regions or gate regions of the trench structure semiconductor elements are formed essentially in the interior of a respective trench structure and, in particular, in a manner electrically insulated from wall regions of the respective trench structure by an insulating oxide layer, in which source regions, body regions and, if appropriate, body contact regions of the trench structure semiconductor elements are in each case arranged in the mesa regions of the semiconductor material region between adjacent trench structures, the source regions in particular in each case being genuinely contained in the assigned body regions and in particular having a common surface region with the latter, in which the source regions and essentially the semiconductor material region are formed with a first conductivity type (n) or conduction type (n) and the body regions and, if appropriate, the body contact regions are formed with a second conductivity type (p) or conduction type (p), and in which a field plate region is provided at least in a first or upper edge region of the cell array and/or of the semiconductor material region and/or in a second or lateral edge region of the cell array and/or of the semiconductor material region.

4. The semiconductor component according to claim 3, comprising providing, at least in the first or upper edge region of the cell array and/or of the semiconductor material region and/or in the second or lateral edge region of the cell array and/or of the semiconductor material region, a surface region or modified doping region which laterally encloses or embeds lateral end regions of the respective trench structure or at least one marginal mesa region with respect to the second or lateral edge region of a corresponding marginal trench structure and in which the doping or dopant concentration is formed such that it is lowered, in particular with respect to an actual doping concentration of a first epitaxial zone, and/or in which the conductivity type or conduction type is formed such that it is opposite to the actual conductivity type (n) or conduction type (n) of the semiconductor material region and, in particular, is of low concentration.

5. The semiconductor component according to claim 4, comprising forming the modified doping region essentially in a manner patterned laterally or over the whole area.

6. The semiconductor component according to claim 4, comprising wherein, in the surface region or in the modified doping region, the concentration of the doping is formed by choosing the dopant concentrations at below approximately 90% or less of the customary dopant concentration of the first epitaxial zone, preferably below approximately 80% thereof, further preferably below approximately 50% thereof, in particular below approximately $10^{16}$ cm$^{-3}$ for a semiconductor component with a breakdown voltage in the region of approximately 60 V.

7. The semiconductor component according to claim 4, comprising extending the surface region or the modified doping region vertically as far as a depth which vertically encloses or embeds the source regions, the body regions and, if appropriate, the body contact regions.

8. The semiconductor component according to claim 4, comprising extending the surface region or the modified doping region vertically as far as a depth which almost reaches the depth of the trench structures, in particular approximately 90% thereof, but does not exceed it.

9. The semiconductor component according to claim 4, comprising forming the surface region or the modified doping region as an epitaxial zone or as a vertical sequence of a plurality of epitaxial zones.

10. The semiconductor component according to claim 3, comprising providing the field plate region in the respective trench structure in an upper section of the trench structure, in particular above undesired breakdown regions of the respective trench structure semiconductor element that are to be avoided.

11. The semiconductor component according to claim 3, comprising wherein the trench structure semiconductor element provided is a trench structure transistor device or a trench transistor, in particular a field plate transistor with a field plate in the respective trench structure, an n-channel trench transistor device, a p-channel trench transistor device and/or a trench transistor with a plurality of electrodes in the trench structure.

12. The semiconductor component according to claim 3, comprising providing a trench structure IGBT as the trench structure semiconductor element.

13. The semiconductor component according to claim 3, comprising forming the semiconductor element cell array such that it is patterned in open fashion.

14. The semiconductor component according to claim 3, comprising forming the semiconductor element cell array such that it is patterned in closed fashion, in particular with additional trench structures or transverse trenches that run transversely with respect to the trench structures.

15. The semiconductor component according to claim 13, comprising wherein the open patterning is realized by providing between the cell array and the first or upper edge region of the cell array and/or of the semiconductor material region or of the chip, at the vertical level of the trench structure, continuously semiconductor material and in particular in the form of a mesa, in particular a silicon material and/or in particular in a manner reaching from the surface of the cell array or of the semiconductor material region or chip as far as the depth of the trench structure.

16. The semiconductor component according to claim 3, comprising forming the cell array by a plurality of essentially identical trench structures that are spaced apart equidistantly in the form of an essentially homogeneous strip arrangement, and in that in particular an essentially homogeneous and strip-type mesa is thereby realized.

17. The semiconductor component according to claim 3, comprising wherein the width $D_{Mesa}$ of the mesa region respectively situated between two adjacent trench structures is less than the width $D_{TRENCH}$ of the trench structure, where in particular $D_{Mesa} < D_{TRENCH}$ holds true.

18. The semiconductor component according to claim 3, comprising wherein the width $D_{Mesa}$ of the mesa region respectively situated between two adjacent trench structures is less than 2.5 times the thickness $D_{FOX}$ of the field oxide in the respective trench structure.

19. A semiconductor component, comprising:
  a semiconductor material region including a semiconductor element cell array of a plurality of trench structure semiconductor elements, the semiconductor element cell array defining an edge region, and
  a modified doping region provided in the edge region, the modified doping region being of a first conductivity type that is opposite to a second conductivity type of the semiconductor material region, wherein the modified doping region extends vertically a depth that is approximately 90% of a depth of the trench structures.

20. The semiconductor component of claim 19, wherein the modified doping region has a low doping concentration with respect to an actual doping concentration of a separate epitaxial zone.

21. The semiconductor component of claim 19, wherein the modified doping region is patterned laterally over substantially an entire area of the edge region.

22. The semiconductor component of claim 19, wherein the modified doping region is formed as one of an epitaxial zone and a vertical sequence of a plurality of epitaxial zones.

23. The semiconductor component of claim 19, wherein each of the plurality of trench structure semiconductor elements is one of a field plate transistor with a field plate in the trench structure, an n-channel transistor device, a p-channel trench transistor device, and a trench transistor with a plurality of electrodes.

24. The semiconductor component of claim 19, wherein the semiconductor element cell array is patterned in an open fashion.

* * * * *